United States Patent [19]

Okumura et al.

[11] Patent Number: 4,538,344

[45] Date of Patent: Sep. 3, 1985

[54] METHOD OF FORMING ELECTRODE/WIRING LAYER

[75] Inventors: Katsuya Okumura, Yokohama; Masaaki Ueda, Kawasaki, both of Japan

[73] Assignee: Tokyo Shibaura Denki Kabushiki Kaisha, Kawasaki, Japan

[21] Appl. No.: 582,223

[22] Filed: Feb. 21, 1984

[30] Foreign Application Priority Data

Feb. 22, 1983 [JP] Japan ................................. 58-28097

[51] Int. Cl.³ ..................... H01L 21/24; H01L 29/46; H01L 21/28
[52] U.S. Cl. ........................................ 29/589; 29/571; 29/578; 148/1.5; 357/59; 357/65; 357/67; 357/71; 427/88; 427/90
[58] Field of Search ..................... 29/571, 578, 576 R, 29/580, 582, 589, 591; 148/1.5; 357/59, 65, 67, 71; 427/88, 90, 84

[56] References Cited

U.S. PATENT DOCUMENTS

| | | | |
|---|---|---|---|
| 3,906,540 | 9/1975 | Hollins | 357/67 S X |
| 3,918,149 | 11/1975 | Roberts | 29/580 |
| 3,996,656 | 12/1976 | Cook | 29/571 |
| 4,291,322 | 9/1981 | Clemens et al. | 357/23 |
| 4,316,209 | 2/1982 | Ho et al. | 357/67 S X |
| 4,322,453 | 3/1982 | Miller | 357/67 S X |
| 4,358,891 | 11/1982 | Roesner | 29/571 |
| 4,361,599 | 11/1982 | Wourms | 427/90 |

FOREIGN PATENT DOCUMENTS

| | | |
|---|---|---|
| 0055161 | 6/1982 | European Pat. Off. . |
| 3218974 | 12/1982 | Fed. Rep. of Germany . |
| 51-14798 | 4/1976 | Japan . |
| 0017393 | 6/1978 | Japan ................................. 357/67 S |
| 58-16337 | 3/1983 | Japan . |
| 2075255 | 11/1981 | United Kingdom . |

OTHER PUBLICATIONS

Kircher et al., "Fabricating a Gate Field-Effect Transistor" IBM Tech. Disc. Bull., vol. 13, No. 3, Aug. 1970, pp. 646-648.

Krausse, "Spreading Resistance Measurements on Silicon with Non-Blocking Aluminum-Silicon Contacts", NBS Special (Pub. 400-10 June 13-14, 1974, pp. 109-122.

Primary Examiner—Brian E. Hearn
Assistant Examiner—David A. Hey
Attorney, Agent, or Firm—Finnegan, Henderson, Farabow, Garrett & Dunner

[57] ABSTRACT

An interconnection structure including an electrode/wiring layer can be formed on a semiconductor substrate by forming on the semiconductor substrate an insulating structure having at least one recess in a surface thereof. At least one polycrystalline silicon layer is formed to fill the recess of the insulating structure. Then, an aluminum layer is formed to cover a surface of the insulating structure and a surface of the polycrystalline silicon layer. The polycrystalline silicon in the polycrystalline silicon layer and the aluminum in a portion of the aluminum layer which corresponds to the polycrystalline silicon layer are converted into a single alloy by heating to form an electrode/wiring layer comprising the single alloy in the recess and connected to a remaining portion of the aluminum layer.

15 Claims, 7 Drawing Figures

F I G. 1E
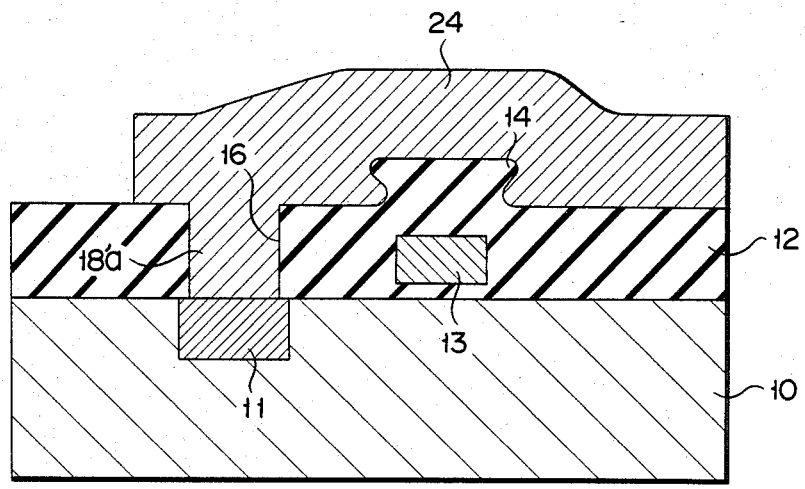
F I G. 2
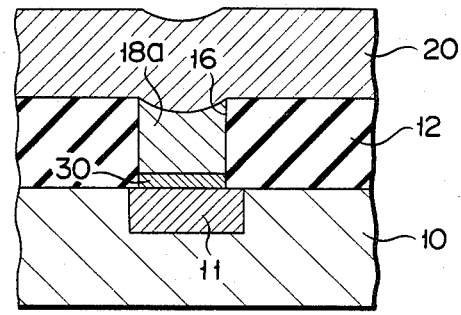
F I G. 3
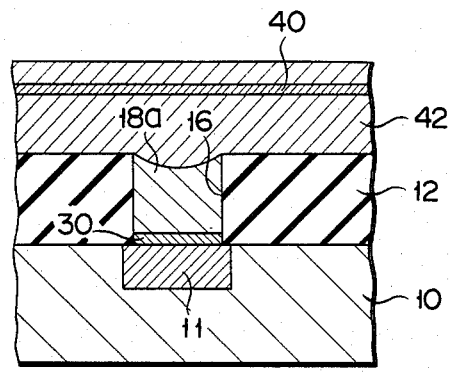

METHOD OF FORMING ELECTRODE/WIRING LAYER

BACKGROUND OF THE INVENTION

1. Field of the Invention

The present invention relates to a method of forming a wiring layer of a semiconductor device and, more particularly, to a method of manufacturing a semiconductor device having a buried electrode structure.

2. Description of the Prior Art

The packing density of semiconductor devices has been increasing recently due to micropatterning. High packing density can be achieved by, for example, micropatterning of a contact hole. The most advanced technique for forming a very small contact hole is reactive ion etching (RIE). A very small contact hole having a very steep wall surface can be obtained by this method. When a very small contact hole with a very steep wall surface is formed by RIE, an electrode layer cannot be properly connected to a semiconductor region formed in a semiconductor substrate by simply depositing an electrode material through this contact hole.

In order to form an electrode layer which is electrically connected to the semiconductor region formed in the substrate through a contact hole formed in an insulating film on the substrate, an electrode material is deposited while the semiconductor substrate is heated. When the substrate is heated, surface diffusion of an electrode material such as aluminum is accelerated, so that the electrode material completely fills the contact hole to achieve good electrical connection between the semiconductor region and the electrode layer.

In the electrode layer forming technique using heating of the substrate, as described above, when the contact hole has a relatively large size of about 3 $\mu$m, step coverage in the contact hole is good, so that the electrode material can be properly deposited on the semiconductor region through this contact hole. However, when the size of the contact hole is decreased to 2 $\mu$m or less, step coverage in the contact hole becomes poor, even if the substrate is heated. In particular, when the size of the contact hole is decreased to 1 $\mu$m or less, the electrode layer will not be electrically connected to the semiconductor region.

In addition, when an aluminum-based metallic material is used as the electrode material, silicon diffuses into the aluminum during annealing, which is performed to achieve good ohmic contact between the electrode material and substrate silicon in the contact hole. When silicon diffuses as described above, a pit is formed in the silicon layer. Aluminum is spiked in the pit. In a planar semiconductor device having a shallow p-n junction depth, the pit may reach the junction. As a result, the breakdown voltage of the p-n junction is decreased, and the reverse leakage current is increased, resulting in inconvenience.

In order to overcome these drawbacks, a method is disclosed in Japanese Patent Disclosure (Kokoku) No. 51-147981, wherein polycrystalline silicon is deposited to cover the entire surface of an insulating layer including a contact hole, after the contact hole is formed in the insulating layer, and aluminum as an electrode material is deposited on the polycrystalline silicon layer and is patterned to obtain a desired wiring pattern. Since the polycrystalline silicon is present under the entire area of the aluminum layer in this method, only part of the polycrystalline silicon layer is diffused into the aluminum layer when annealing is performed to achieve good ohmic contact. Therefore, only part of a contact portion between the polycrystalline silicon layer and the aluminum layer is alloyed. However, in the final electrode/wiring structure, most of the electrical connection of the structure with the substrate is achieved by polycrystalline silicon layer, so the contact resistance cannot be decreased, resulting in inconvenience. The decrease in electrical resistance of polycrystalline silicon is limited even if an impurity is doped at a high dose. The electrical resistance of polycrystalline silicon cannot be decreased like that of a metal. In this prior art, an impurity having the same conductivity type as that of the impurity doped in the semiconductor region, is doped in the polycrystalline silicon layer to assure electrical connection between the electrode/wiring layer and the semiconductor region, even if the contact hole is misaligned with respect to the semiconductor region. However, according to this method, as the impurity having a conductivity type determined by that of the semiconductor region is doped in the polycrystalline silicon layer, this conventional method cannot be used in the manufacture of a CMOSFET IC having p- and n-channel transistors.

SUMMARY OF THE INVENTION

It is an object of the present invention to provide a method capable of substantially solving the conventional problems described above, i.e., preventing an incomplete contact due to an electrical disconnection, forming an electrode/wiring structure which is capable of achieving good electrical contact between a semiconductor substrate and an electrode/wiring layer even through a very small contact hole, and increasing the yield of high-reliability semiconductor devices.

In order to achieve the above object of the present invention, there is provided a method of forming an interconnection structure, including an electrode/wiring layer, on a semiconductor substrate, comprising the steps of:

(a) forming on a semiconductor substrate an insulating structure having at least one recess in a surface thereof;

(b) forming at least one polycrystalline silicon layer filling only said recess of said insulating structure;

(c) forming an aluminum layer to cover a surface of said insulating structure and a surface of said polycrystalline silicon layer; and (d) converting polycrystalline silicon in said polycrystalline silicon layer and aluminum in a portion of said aluminum layer which corresponds to said polycrystalline silicon layer into an alloy by heating to form an electrode/wiring layer comprising said alloy in said recess and connected to a remaining portion of said aluminum layer.

According to an embodiment of the present invention, the substrate comprises silicon.

The recess includes a contact hole partially exposing the surface of the semiconductor substrate or the like.

In accordance with an aspect of the present invention, a barrier layer is formed on that surface portion of the semiconductor substrate which is exposed by the recess to prevent a reaction between the substrate silicon and aluminum.

Furthermore, in accordance with another aspect of the present invention, an alloying promotion layer made of a transition metal is formed on the aluminum layer.

BRIEF DESCRIPTION OF THE DRAWINGS

FIGS. 1A to 1E are sectional views for explaining the steps of manufacturing a semiconductor device according to an embodiment of the present invention;

FIG. 2 is a sectional view for explaining another embodiment of the present invention; and FIG. 3 is a sectional view for explaining still another embodiment of the present invention.

DESCRIPTION OF THE PREFERRED EMBODIMENT

Figure 1A:
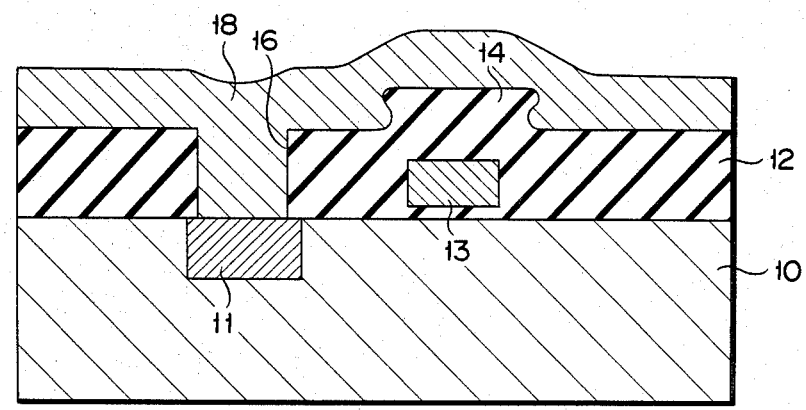

The present invention will be described in detail with reference to the accompanying drawings. The same reference numerals denote the same parts throughout the drawings.

Referring to FIG. 1A, an oxide film is formed on a semiconductor substrate such as a silicon substrate 10 having p- or n-type semiconductor regions (only one semiconductor region 11 is illustrated). The surface of the semiconductor region 11 is exposed through the oxide film. A conductive layer 13 such as a gate electrode with a predetermined pattern is formed on the gate oxide film. For simplicity, the first-mentioned oxide film and the gate oxide film are indicated by an oxide film 12. The oxide film 12 projects above the gate electrode by its thickness so as to form a stepped portion 14 with the remaining flat surface portions. The thickness of the oxide film 12 excluding the portion where the gate electrode is formed is about 1 μm.

The oxide film 12 is selectively etched by RIE to form a contact hole 16 having a size of about 1 μm □ so as to expose a surface portion of the semiconductor region 11. A relatively flat (undoped) polycrystalline silicon layer 18 is deposited on the oxide film 12 to cover the stepped portion 14 and fill the contact hole 16. The polycrystalline silicon layer 18 can be formed by such a technique as low pressure chemical vapor deposition (low pressure CVD) by which the very small contact hole and the stepped portion can be covered or filled with polycrystalline silicon subjected thereto. It should be noted that the polycrystalline silicon layer 18 will be more slowly alloyed with aluminum when an n-type impurity is doped therein. As is well-known, polycrystalline silicon has good step coverage characteristics as compared with those of metal such as aluminum, so that polycrystalline silicon can completely fill the very small contact hole.

Figure 1B:
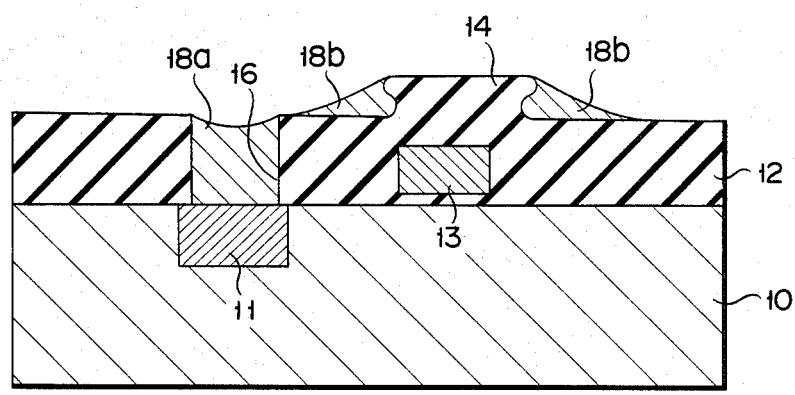

Thereafter, the polycrystalline silicon layer 18 is plasma-etched to leave a portion 18a filling the contact hole 16 and portions 18b covering the steps of the stepped portion 14 (FIG. 1B).

Figure 1C:
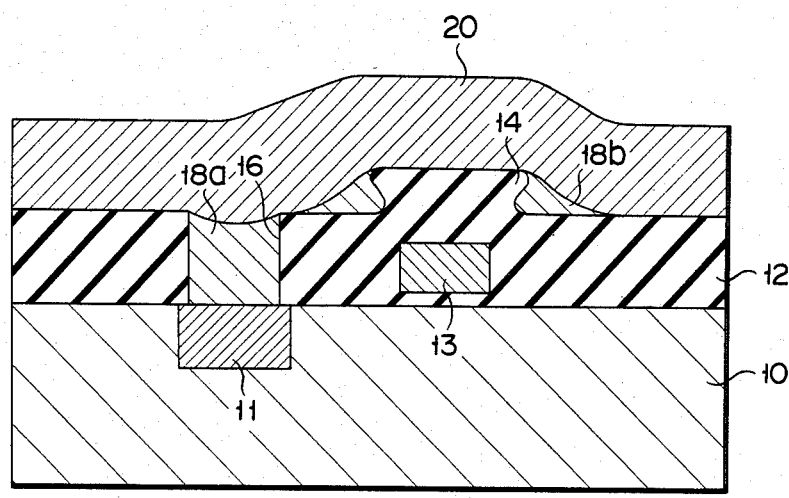

Aluminum is then deposited to cover the entire surface (surfaces of the portions 18a and 18b, and the surface portion of the oxide film 12 which is exposed by the plasma etching) of the structure of FIG. 1B, thereby forming an aluminum layer 20 having a thickness of about 1 μm (FIG. 1C). Preferably the surface of the structure of FIG. 1B is cleaned by inverse sputtering using argon ions before the aluminum layer 20 is formed. A natural oxide film which may be formed on the portions 18a and 18b during the plasma etching would impair the contact with the aluminum layer 20, and thus the inverse sputtering is used to remove it. It should be noted that the substrate need not be heated when aluminum is deposited.

Figure 1D:
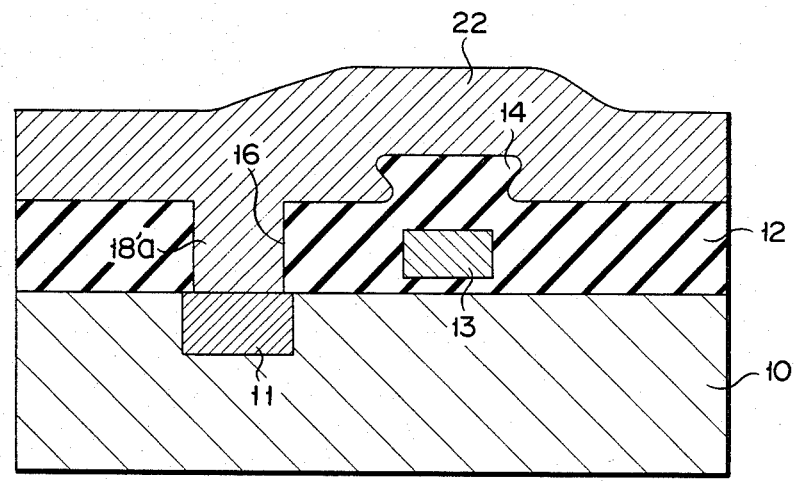

Thereafter, the structure of FIG. 1C is annealed at a temperature of, for example, about 450° C. for 30 minutes. Silicon atoms of the portion 18a filling the contact hole 16 and the portions 18b left on the steps of the stepped portion 14 diffuse into corresponding portions of the aluminum layer, and aluminum atoms diffuse into the portions 18a and 18b, so that an alloy of silicon and aluminum is substantially formed in the portion 18a in the contact hole 16 producing an electrode layer 18a'. Similarly, silicon is alloyed with aluminum in the portions 18b on the steps of the stepped portion 14, thereby producing a wiring layer with the remaining portion of the aluminum layer. The portion of the aluminum layer 20 which is adjacent to the electrode layer 18a' is converted to the same alloy as that of the electrode layer 18a'. As a result, an electrode/wiring layer 22, which includes the electrode layer 18a' is formed (FIG. 1D).

Finally, the electrode/wiring layer 22 is patterned to obtain a predetermined electrode/wiring structure 24 (FIG. 1E). Alloying may be performed after this patterning.

According to the method described above, polycrystalline silicon with good step coverage characteristics is used to substantially completely fill a recess (the contact hole 16 and the stepped portion 14) of the insulating pattern 12 on the substrate. Polycrystalline silicon in the recess is reacted with aluminum to form an alloy. Therefore, the electrode layer finally obtained is properly connected to the substrate 10 (semiconductor region 11) through the contact hole 16 (even if the contact hole 16 is very small), thereby preventing incomplete contact due to disconnection. In addition, polycrystalline silicon in the contact hole 16 is substantially converted to an alloy with aluminum, so that the contact resistance between the alloy and the substrate is sufficiently low. In addition to this advantage, the substrate need not be heated when the aluminum layer 20 is formed, so that operability is increased and the heater can be eliminated, thus decreasing the manufacturing cost. Therefore, semiconductor devices with higher reliability can be obtained with good yield according to the method of the present invention.

The embodiment of FIG. 2 is substantially the same as that of FIGS. 1A to 1E, except that a transition metal (e.g., titanium, molybdenum, niobium or platinum; preferably titanium) silicide barrier layer 30 is formed on a portion of the surface of the semiconductor region 1 which is exposed through the contact hole 16. The silicide barrier layer 30 is formed by deposition of a transition metal and subsequent heating to cause a chemical reaction between the transition metal and substrate silicon. A reaction which may take place between the aluminum layer 20 and the silicon substrate can be prevented by the presence of the silicide barrier layer 30.

As shown in FIG. 3, when a transition metal (e.g., titanium, molybdenum, niobium or platinum) layer 40 is formed in an aluminum layer 42, the above-noted alloying is promoted. The transition metal tends to be covered to a silicide, so that silicon atoms are absorbed from the portion 18a during annealing. As a result, the diffusion of the silicon atoms into the aluminum layer 20 can be accelerated. The aluminum layer 42 including the alloying promotion layer 40 is formed such that the transition metal layer 40 is formed after the aluminum layer 20, as described with reference to FIG. 1C, and then aluminum is deposited again thereon. The transition metal is preferably a material which can be easily converted to a silicide at a relatively low temperature, and which provides a silicide with a high silicon content (i.e., the material which can combine with the greater number of silicon atoms). In this sense, titanium is the most preferred transition metal.

The main feature of the present invention lies in the fact that polycrystalline silicon is left only in the recess of the insulating structure, and thereafter aluminum is deposited. When polycrystalline silicon is present under the entire area of the aluminum layer, as described with reference to the above-mentioned Japanese Patent Disclosure, polycrystalline silicon is excessive with respect to aluminum. Therefore, all the polycrystalline silicon cannot be converted into the alloy. Polycrystalline silicon which is spaced apart from aluminum is left non-reacted. Typically this occurs in the contact hole. According to this conventional method, an alloy spike into the silicon substrate can be prevented, but polycrystalline silicon in the contact hole is left non-reacted. Therefore, a low contact resistance between the polycrystalline silicon layer and the silicon substrate cannot be obtained. To the contrary, according to the method of the present invention, polycrystalline silicon is left only in the recess, so that the amount of polycrystalline silicon is small with respect to that of aluminum. As a result, all the polycrystalline silicon can be completely converted into the alloy, and an electrode structure with good substrate contact can be formed without causing an alloy spike.

What is claimed is:

1. A method of forming an interconnection structure, including an electrode/wiring layer, on a semiconductor substrate, comprising the steps of:
   forming on the semiconductor substrate an insulating structure having a recess which extends from the surface of said semiconductor substrate to the exterior surface of said insulating structure;
   forming a polycrystalline silicon body within said recess of said insulating structure, said polycrystalline silicon body filling only said recess;
   forming an aluminum layer to cover the entire polycrystalline silicon body and a surface of said insulating structure surrounding said polycrystalline silicon body, said aluminum layer being sufficiently large relative to said polycrystalline silicon body to allow said polycrystalline silicon body to convert completely into a silicon aluminum alloy during a heating process; and
   converting through a heating process substantially all of the polycrystalline silicon in said polycrystalline silicon body and the aluminum in the portion of said aluminum layer adjacent to said polycrystalline silicon body into an alloy of aluminum and silicon to form an electrode/wiring layer establishing a good electrical contact with the semi-conductor substrate, the electrode/wiring layer comprising the alloy formed in said recess and the remaining portion of said aluminum layer.

2. A method according to claim 1, wherein said semiconductor substrate comprises silicon.

3. A method according to claim 2, wherein said recess comprises a contact hole through which a portion of the surface of said semiconductor substrate is partially exposed.

4. A method according to claim 3, further comprising the step of forming a barrier layer on the portion of the surface of said semiconductor substrate which is exposed through said recess to prevent a reaction between the substrate silicon and the aluminum.

5. A method according to claim 4, wherein said barrier layer is made of a silicide of a transition metal.

6. A method according to claim 5, wherein said transistion metal is a material selected from the group consisting of titanium, molybdenum, niobium and platinum.

7. A method according to claim 3, further comprising the step of forming an alloying promotion layer made of a transition metal on said aluminum layer to accelerate the diffusion of the silicon atoms into the aluminum layer.

8. A method according to claim 7, wherein said transition metal is selected from the group consisting of titanium, molybdenum, niobium and platinum.

9. A method according to claim 1 wherein the conversion step is performed by annealing the semiconductor substrate, the insulating structure, the polycrystalline silicon body and the aluminum layer at about 450° C. for approximately 30 minutes.

10. A method of forming an electrode layer on a silicon substrate having a semiconductor region therein comprising the steps of:
    forming an insulating structure on the silicon substrate having a semiconductor region therein, said insulating member having a recess which extends from the surface of said semiconductor region to the exterior surface of said insulating structure and exposes a surface of said semiconductor region;
    forming a polycrystalline silicon body within said recess of said insulating structure, said polycrystalline silicon body filling only said recess;
    forming an aluminum layer to cover the entire polycrystalline silicon body and a surface of said insulating structure surrounding said polycrystalline silicon body, said aluminum layer being sufficiently large relative to the polycrystalline silicon body to allow said polycrystalline silicon body to convert completely into a silicon aluminum alloy during a heating process; and
    converting through a heating process substantially all of the polycrystalline silicon in said polycrystalline silicon body and the aluminum in the portion of the aluminum layer adjacent to said polycrystalline silicon body into an alloy of aluminum and silicon to form an electrode layer establishing a good electrical contact with the semiconductor region, the electrode layer comprising the alloy formed in said recess.

11. A method according to claim 10, further comprising the step of forming a barrier layer on a surface of said semiconductor region which is exposed through said contact hole to prevent a reaction between substrate silicon and aluminum.

12. A method according to claim 11, wherein said barrier layer comprises titanium silicide.

13. A method according to claim 10, further comprising the step of forming an alloying promotion layer which comprises a transition metal on said aluminum layer to accelerate the diffusion of the silicon atoms into the aluminum layer.

14. A method according to claim 13, wherein said alloying promotion layer comprises titanium.

15. A method according to claim 10 wherein the conversion step is performed by annealing the semiconductor substrate, the insulating structure, the polycrystalline silicon body and the aluminum layer at about 450° C. for approximately 30 minutes.

* * * * *